United States Patent
Cheng et al.

(10) Patent No.: US 7,692,976 B2
(45) Date of Patent: Apr. 6, 2010

(54) MEMORY DEVICE WITH CONTROL CIRCUIT FOR REGULATING POWER SUPPLY VOLTAGE

(75) Inventors: Zhibin B. Cheng, Cary, NC (US); Satyajit Dutta, Austin, TX (US); Peter J. Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/780,038

(22) Filed: Jul. 19, 2007

(65) Prior Publication Data

US 2008/0013395 A1    Jan. 17, 2008

Related U.S. Application Data

(62) Division of application No. 11/331,618, filed on Jan. 13, 2006, now Pat. No. 7,366,036.

(51) Int. Cl.
  *G11C 5/14* (2006.01)
(52) U.S. Cl. .................................. 365/189.09
(58) Field of Classification Search ............. 365/189.09
  See application file for complete search history.

(56) References Cited

U.S. PATENT DOCUMENTS

| 6,034,563 | A  | 3/2000  | Mashiko |
| 6,097,113 | A  | 8/2000  | Teraoka et al. |
| 6,222,410 | B1 | 4/2001  | Seno |
| 6,329,874 | B1 | 12/2001 | Ye et al. |
| 6,333,571 | B1 | 12/2001 | Teraoka et al. |
| 6,380,798 | B1 | 4/2002  | Mizuno et al. |
| 6,567,319 | B2 | 5/2003  | Sato et al. |
| 6,657,911 | B2 | 12/2003 | Yamaoka et al. |
| 6,714,461 | B2 * | 3/2004 | Matsumoto et al. ..... 365/189.05 |
| 6,794,914 | B2 | 9/2004  | Sani et al. |
| 6,999,370 | B2 * | 2/2006 | Luk et al. .................... 365/226 |

OTHER PUBLICATIONS

Kawaguchi, Hiroshi, et al., A Reduced Clock-Swing Flip-Flop (RCSFF) for 63% Power Reduction, IEEE Journal of Solid-State Circuits, vol. 33, No. 5, pp. 807-811 (May 1998).
Tschanz, James W., et al., Dynamic Sleep Transistor and Body Bias for Active Leakage Power Control of Microprocessors, IEEE Journal of Solid-State Circuits, vol. 38, No. 11, pp. 1838-1845 (Nov. 2003).
Kim, Chris H., et al., Dynamic Vt SRAM: A Leakage Tolerant Cache Memory for Low Voltage Microprocessors, ACM, ISLPED '02, Monterey, Calif., pp. 251-254 (Aug. 12-14, 2002).

(Continued)

*Primary Examiner*—Hoai V Ho
*Assistant Examiner*—Anthan T Tran
(74) *Attorney, Agent, or Firm*—Dillon & Yudell LLP

(57) ABSTRACT

A Local Dynamic Power Controller (LDPC) generates and deliver to a load a full swing voltage supply signal and a reduced swing voltage supply signal. Both the full and reduce voltage supply signals are generated from a single power supply. The full swing voltage supply signal is supplied when the load is in full operational mode whereas the reduce voltage supply signal is provided when the load is in a sleep mode. As a consequence, power dissipated in the load is reduced.

14 Claims, 7 Drawing Sheets

OTHER PUBLICATIONS

Strolle, A.G.M., et cl., New Clock-Gating Techniques for Low-Power Flip-flops, ACM, ISLPED '00, Rapallo, Italy, pp. 114-119 (2000).

Elakkumanan, Praveen, et al., NC-SRAM—A Low Leakage Memory Circuit for Ultra Deep Submicron Designs, IEEE, pp. 3-6 (2003).

Agarwal, Amit, et al., A Single-Vt Low-Leakage Gated-Ground Cache for Deep Submicron, IEEE, pp. 319-328 (2003).

Powell, Michael, et al., Gated-Vdd: A Circuit Technique to Reduce Leakage in Deep-Submicron Cache Memories, ACM, ISLPED '00, Rapallo, Italy, 6 pages (2000).

* cited by examiner

MEMORY DEVICE WITH CONTROL CIRCUIT FOR REGULATING POWER SUPPLY VOLTAGE

CROSS-REFERENCE TO RELATED APPLICATION

This is a divisional application which claims priority of patent application Ser. No. 11/331,618, filed Jan. 13, 2006.

BACKGROUND OF THE INVENTION

1. Field of Invention

The present invention relates to semiconductor integrated circuits in general and in particular to control circuits and method used to reduce power consumption in said semiconductor integrated circuits.

2. Description of Background Art

Most, if not all, equipment or appliances used in the workplace and/or home includes some type of semiconductor integrated circuit component, sometimes called Very Large Scale Integrated (VLSI) circuits, packaged as a chip or module. Even though the circuits are integrated on a substrate, logically they can be partitioned into a number of well known subsystems or components which may include latch array, SRAM, inverters, etc. For optimum performance adequate power must be provided to the subsystems or components. The power is usually provided via a power supply. operational mode. Several prior art patents attempt to solve this problem. Examples of such patents include U.S. Pat. Nos. 6,794,914, 6,657,911, 6,380,798, 6,333,571, 6,329,874, 6,222,410, 6,097,113, and 6,034,563, The prior art also provides other approaches to address this problem. The clock system, composed by flip-flops and clock distribution network, is one of the most power consuming sub-systems in a VLSI circuit. Many techniques have been proposed to reduce clock system dissipation. Among them, Clock-Gating technique used for disabling the clock in inactive portions of the chip is generally considered as a useful approach for power reduction. The Double Gating and NC$^2$MOS techniques apply gating technique separately to the master and slave latch, where a 20% to 40% power reduction is achieved when input switching activity is at about 10%. Since the Clock-Gating is used with lower granularity level, so the area overhead is the major problem for this technique. Other approaches have focused on the dynamic $V_t$ technique, Power-Gating and alternative power supply for the memory core circuits, such as SRAM cells. In order to reduce leakage power dissipation, dynamic $V_t$ technique creates low and high threshold voltages for the transistors with the memory core by applying dynamic body bias through a Local Bias Generator (LBG). In general, this approach requires some additional power supply and circuitry. The Power-Gating technique can significantly reduce the leakage power when memory is in drowsy mode, but the circuit may not retain the data under certain conditions and process variations. The alternative power supply technique uses nMOS pass gates to switch power supply for a memory block in order to reduce leakage power when it is not operational. The major drawback of this approach is that it also requires additional power resources. Further teachings on these techniques are set forth in the following documents:

H. Kawaguchi and T. Sakurai, "A Reduced Clock Swing Flip-Flop (FCSFF) for 63% Power Reduction", IEEE Journal of Solid-State Circuits, 34(3), March 1999, pp. 405-414.

A. G. M. Strollo, E. Napoli and D. DeCaro, "New Clock-Gating Techniques for Low-Power Flip-Flops", C. H. Kim and K. Roy, "Dynamic $V_t$ SRAM: A Leakage tolerant Cache Memory for Low Voltage Microprocessors", Int. Symp. Low Power Electronics and Design (ISLPED), August 2002, pp. 251-254.

J. W. Tschanz, S. G. Narendra, et al, "Dynamic Sleep Transistor and Body Bias for Active Leakage Power Control of Microprocessors", IEEE Journal of Solid-State Circuits, 38(aa), November 2003, pp. 1838-1845.

M. Power, K. Roy et al., "Gated-Vdd: A Circuit Technique to Reduce Leakage in Cache Memories", Int. Symp. Low Power Electronics and Design (ISLPED), July 2000, pp. 90-95.

A. Agarwal, H. Li and K. Roy, "A Single-$V_t$ Low-Leakage Gated-Ground Cache for Deep Submicron", IEEE Journal of Solid State Circuits, vol. 38, February 2003, pp. 319-328.

P. Elakkumanan, and A. Narasimhan et al., "NC-SRAM—A Low-Leakage Memory Circuit for Ultra Deep Submicron designs", IEEE SOC conference proceedings, September 2003, p. 3-6.

In view of the above a more efficient apparatus and method to reduce leakage current in VLSi circuits and/or storage systems is required. The reduction of leakage current ultimately results in less power consumption in the VLSI circuit.

SUMMARY OF THE INVENTION

A circuit arrangement termed Local Dynamic Power Controller (LDPC) includes switching devices that cause full voltage swing between Vdd and Gnd of a power supply to be applied to the VLSI and/or storage system during active operational mode and a reduced voltage swing between Vd and Gd to be applied during non-operational mode.

The LPDC does not require additional power resources since the reduced voltage (Vd and Gd) is generated from the normal power supply voltage required to provide power to the VLSI circuit and/or storage system to which the LPDC is coupled.

When the LPDC is coupled to a memory system the combined system creates a virtual power supply that is robust under process variations and consequently retains data stored in the memory system. Based upon simulation results it has been determined the LPDC technique results in approximately 80% leakage current reduction and has no degradation in latch performance.

DETAILED DESCRIPTION

The controller describe herein can be used with different types of circuits to control leakage current within them. It works well with memory systems such as latch, SRAM register file, etc., and as such will be describe in that environment. However, this should not be construed as a limitation on the scope of the invention since it is well within the skills of one skilled in art to make minor changes and adapt the controller for other uses. It is intended that any such modification should be covered by the claims set forth herein.

Figure 1:
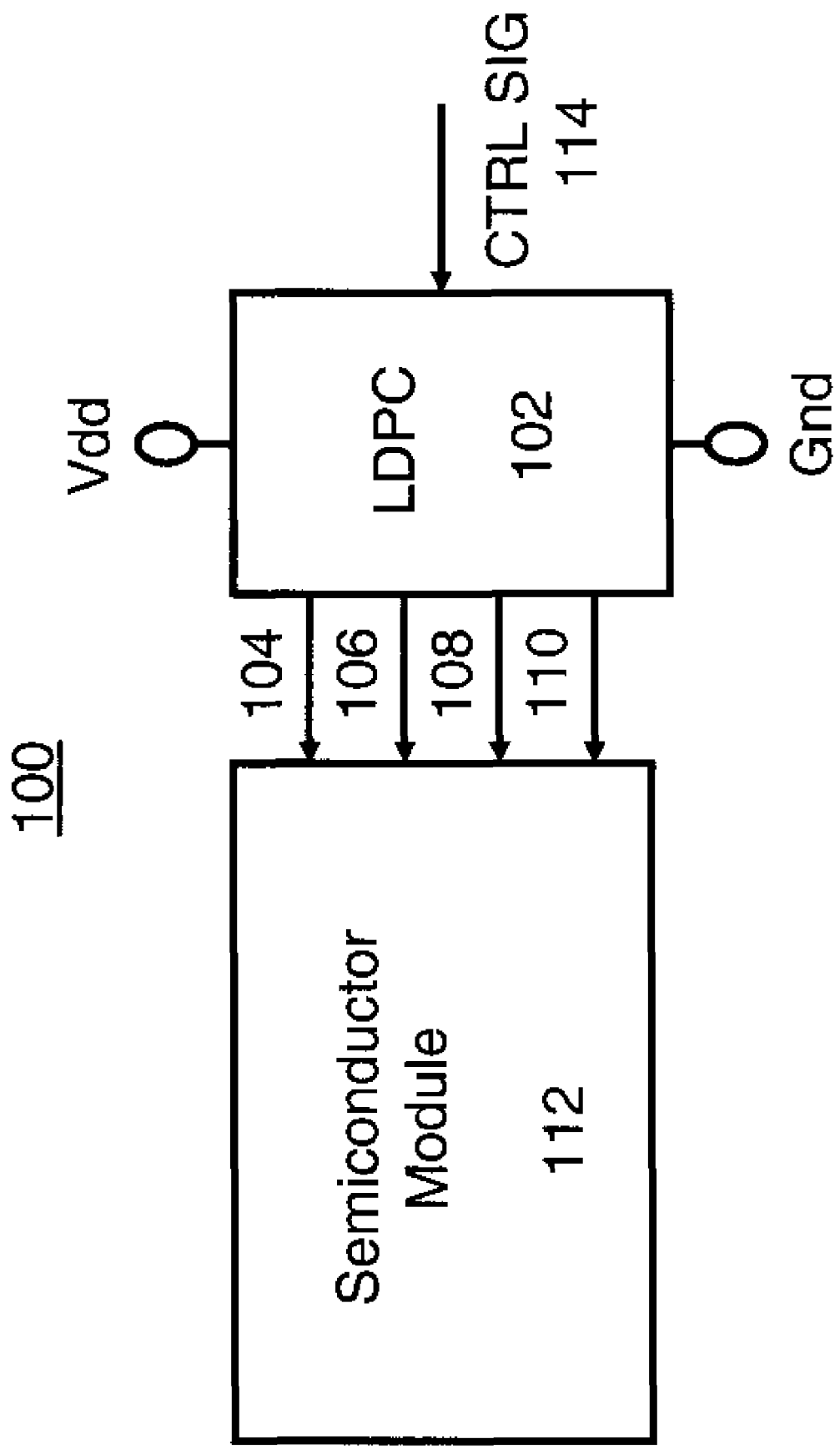
FIG. 1 shows a block diagram of a combined semiconductor module and LPDC according to teachings of the present invention.

FIG. 1 shows the block diagram of system 100 according to the teachings of the present invention. System 100 includes semiconductor module 112, transmission paths 104, 106, 108, 110 and Local Dynamic Power Controller (LDPC) 102. A transmission path label control signal (CTRL SIG) 114 presents control signal to LDPC 102. A power supply (not shown) provides power supply voltages to LDPC 102 on nodes label Vdd and Ground (Gnd). LDPC 102 is coupled over respected ones of transmission paths 104, 106, 108, 110 to semiconductor module 112. Semiconductor module 112 can be any type of integrated circuitry and/or memory system that requires control of leakage current therein. Such leakage current usually results in unacceptable power dissipation within the semiconductor module. To reduce the leakage power consumption, the circuits (to be describe hereinafter) in LDPC 102 causes the full power supply voltage Vdd and Ground (Gnd) to be transported over conductors 104 and 110 to semiconductor module 112. When the semiconductor module is in full operational mode and a reduced power supply voltage over conductors 106 and 108 when the semiconductor module is operating in mode less than full operation. The full voltage swing between Vdd and Gnd is presented to semiconductor module 112 when the control signal terminal 114 is in a first state, say logical "1". The signal on controlled signal line 114 is active when the semiconductor module 112 is active. When the semiconductor module 112 is inactive the signal on control signal line 114 changes to a second state, say logical "0". As a result of this change the circuits (to be described herein) in LDPC 102 generate a reduce power supply voltage from Vdd and Gnd and forward the reduce the power supply voltage over conductor 106 and 108 to semiconductor module 112. The reduce voltage causes reduction in the leakage current and reduction in the power dissipated within semiconductor module 112. Even though semiconductor module 112 and LDPC 102 are shown as separate entities in an actual design both would probably be integrated on a chip or similar structure. As a consequence the showing in FIG. 1 is only for illustration purposes and should not be construed as limitations on the scope of the invention.

Figure 2:
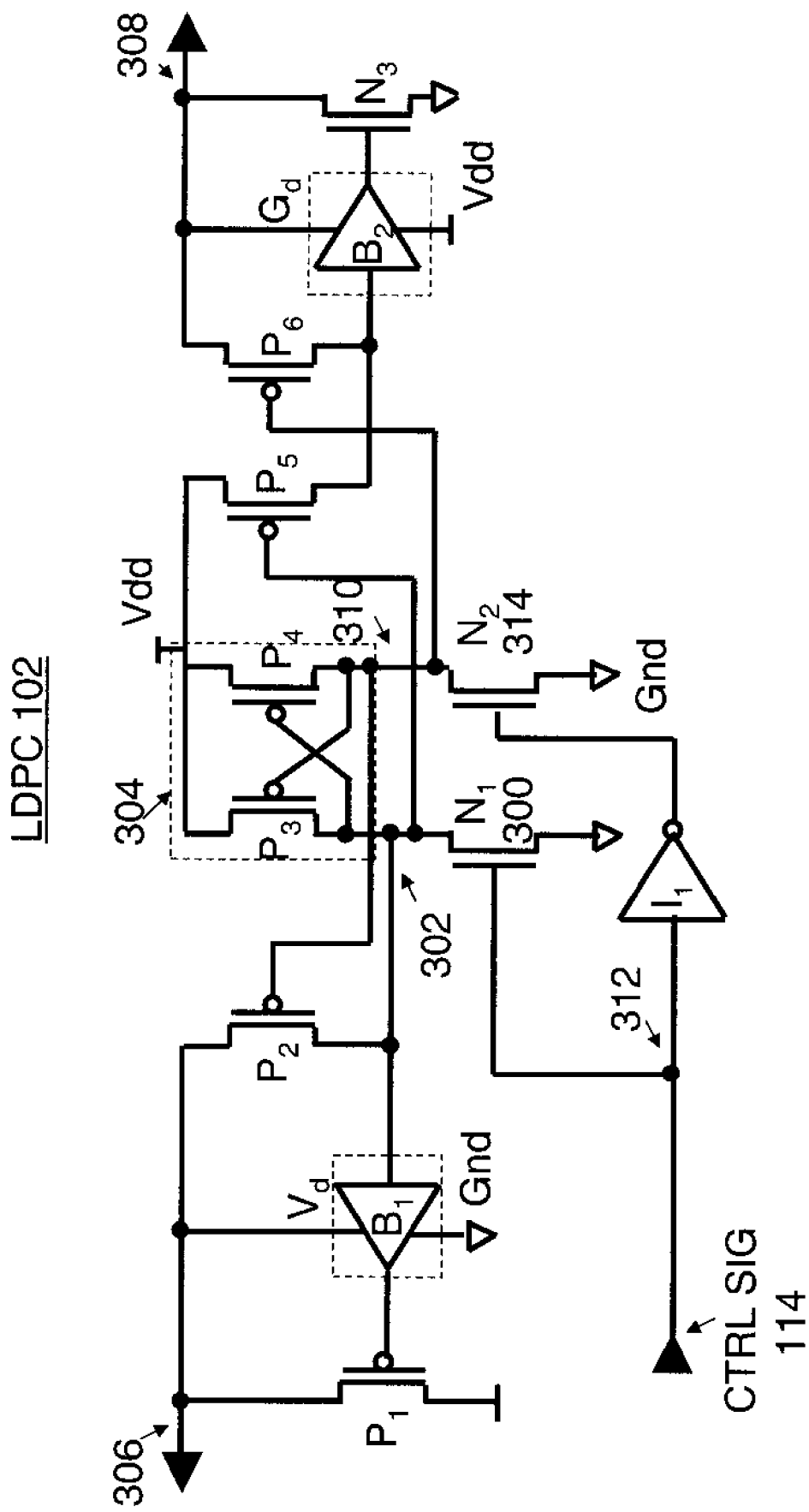
FIG. 2 shows a circuit diagram of the LPDC according to teachings of the present invention.

FIG. 2 shows a circuit diagram for LDPC 102. The function of local dynamic power controller (LDPC) 102 is to transpose a regular power supply voltage Vdd/Gnd to node 306 and 308. As used in this document, a regular power supply voltage means a voltage of sufficient magnitude to satisfy the power requirements of device module or circuit to which the LDPG is coupled. The circuit also generates a reduce supply voltage from Vdd/Gnd and applies the reduce power supply voltage to nodes 306 and 308. To make this possible, control signal 114 is either in a state, term, busy, in which a signal is a logical "1" or in a none busy state in which the signal is a logical "0". The state of the control signal "1" or "0" depends on the state of the device to which the controller 102 is connected. For purposes of discussion when the connected device or system is in an active mode the signal on controlled signal line 114 is a logical "1" whereas the signal is a logical "0" when the connected system is inactive or in a sleep mode requiring less power.

Still referring to FIG. 2, the LDPC 102 includes switching gate 300N1 connecting node 302 to Gnd. In the preferred embodiment of this invention 300 N1 is a N FET device. Control signal 114 is coupled by conductor 312 to the gate electoral of 300 N1. Back to Back PFET structure 304 couples node 302 to Vdd. A transmission path comprising components buffer B1 and PFET P1 interconnect node 302 to node 306. As it will be explained subsequently when P1 and B1 conducts the full voltage swing between Vdd and Gnd is transpose to node 306. Likewise, PFET device P5, buffer B2 and FET device N3 couple node 302 to node 308. When components P5, B2, and N3 are in conductive state Gnd potential is provided on node 308. It should be noted that control (Ctrl) signal (SIG) 114 is a logical "1" when the power supply voltage Vdd/Gnd is provided on 306 and 308, respectively. In this state Vd, upper end of the reduced voltage component, is equal to Vdd and Vd, lower end of the reduced voltage component, is equal to Gnd. In operation, when control signal 114 is a logical "1" P3 is on and provide current for charging node 302 from Vdd. In addition, P5 is on, P6 is off and buffer B2 turns on N3, thus causing ground potential to be placed on node 308. It should be noted that in this state Gd equals Gnd. Likewise, N1 is on, P2 is off, P1 is on, and Vdd is applied to terminal 306. In this configuration a device which is connected to node 306 and 308 is presented with a full voltage swing of the supply voltage between terminals Vdd and Gnd.

Still referring to FIG. 2 this circuit also uses the supply voltage Vdd/Gnd to generate a reduced voltage swing which is also presented on node 306 and 308, respectively. The circuit which generate the reduced supply voltage from supply voltage Vdd/Gnd includes switching gate 314 N2 connecting node 310 to Gnd. Back to back PFET structure 304 couples node 310 to Vdd, inverter I1 interconnect control signal 114 to the base of switching gate 314 N2, PFET device P6, buffer B2 and N3. When 314 N2 conducts, P6, B2 and N3 couple node 310 to 308 to provide the low end of the reduced voltage Vd/Gd. Likewise, PFET device P2, B1 and PFET device P1 provide the upper voltage component Vd of reduced power supply Vd/Gd on node 306. In reduced voltage configuration Vd is less than Vdd (Vd<Vdd) and Gd is greater than Gnd (Gd>Gnd). For reduce voltage generation control signal 114 changes state from logical "1" to logical "0". As stated previously this change in state indicates the device which is connected to terminal 306 and 308 is in inactive mode. With control Signal 114 at logical "0" inverter I1 changes it to a logical "1" to turn 314 N2 into its "ON" state. This causes P3 to conduct charging node 310. In addition, P5 is off, P6 is on, N3 is biased and Gd is output on terminal 308. It should be noted Gd>Gnd. With N2 on P2 is also on and B1 passes the signal to basis P1 and Vd is provided on node 306. It should be noted when the reduced voltage Vd/Gd is provided on terminal 306 and 308, respectively devices P1 and N3 are saturated to operate as diodes.

Figure 6:
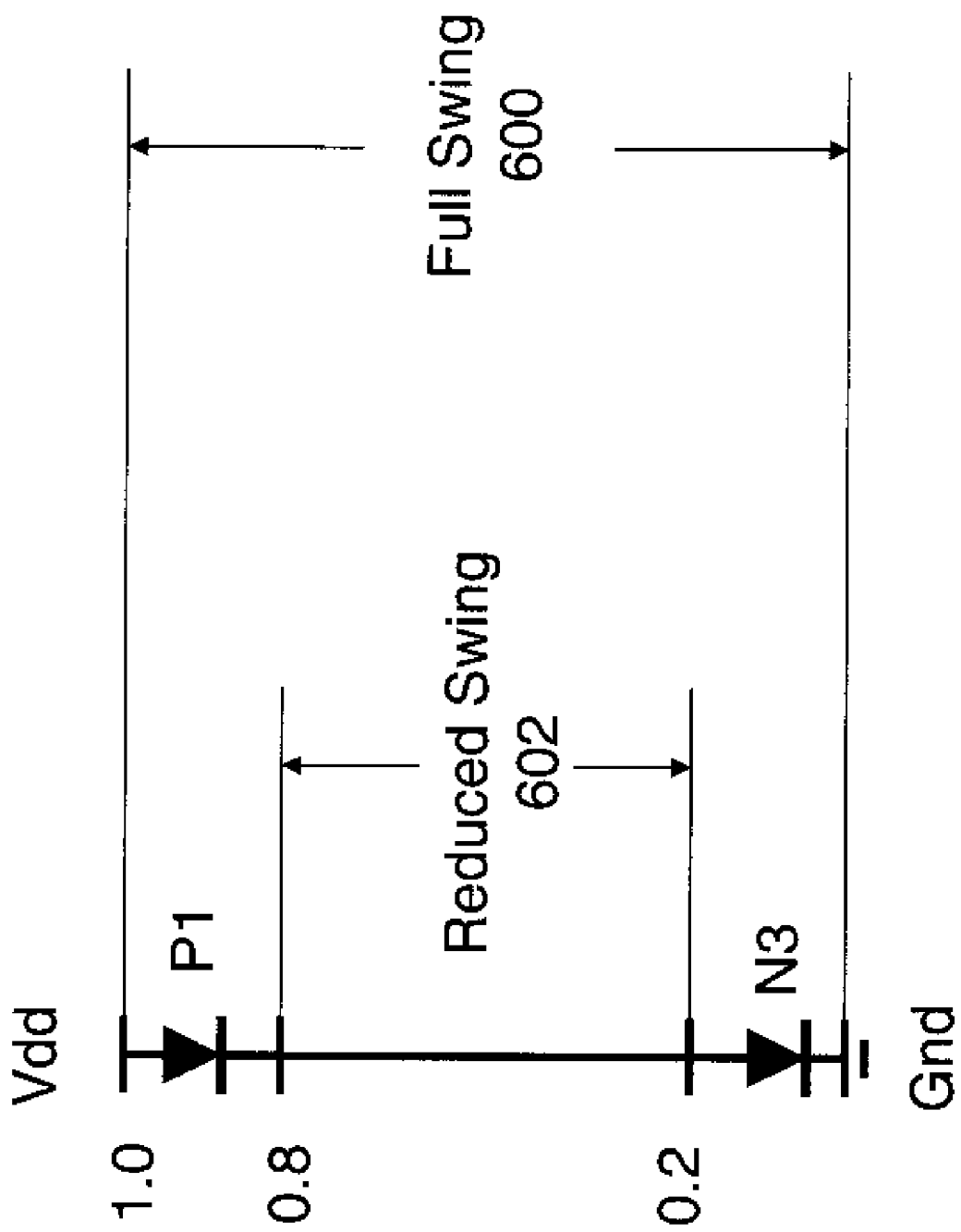
FIG. 6 shows a graphical representation of voltages generated according to teachings of the present invention.

Turning to FIG. 6 for the moment a graphical representation of the voltages generated by the controller in FIG. 2 is shown. Depending on the state of control signal 114, FIG. 2, either the full voltage swing 600 of power supply Vdd/Gnd or reduced voltage swing 602 of reduced power supply Vd/Gd is presented on node 306 and 308, respectively. In particular, when the control signal 114 on conductor 312 (FIG. 2) is a logical "1" the full swing 600 of power supply Vdd/Gnd is applied to node 306 and 308, respectively. When control signal 114 changes from logical "1" to logical "0" the reduced voltage swing 602 is presented on node 306 and 308, respectively. In the preferred embodiment of this invention Vdd is made to be 1 volt whereas Gnd is 0 volts. As a consequence the full swing 600 upper power supply is between 1 volt and 0 volts. For the reduced voltage swing 602, Vd is made equal to 0.8 volts and Gnd is 0.2 volts. The devices that causes the change from full swing 600 to reduce swing 602 are shown in FIG. 6 as P1 and N3. As stated above P1 and N3 (FIG. 2) are driven into saturation and bias as diodes when the signal on conductor 312 is logical "0". It should be noted the values used for the voltages and type of devices used to create the voltage drop should not be construed as a limitation on the scope of this invention. Since it is well within the skill of one skilled in the art to select other voltage values or devices type to create voltage drop without deviation from the teachings of the present invention.

Figure 3:
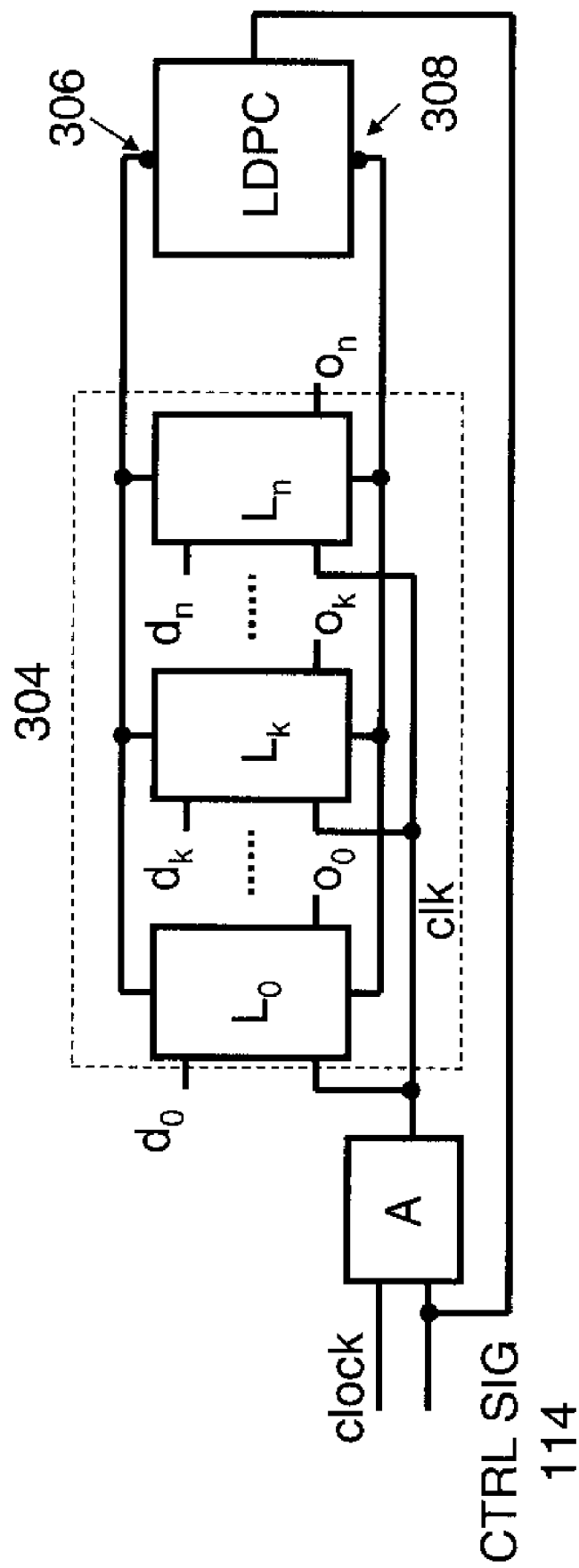
FIG. 3 shows a combined latch array and LPDC according to teachings of the present invention.

FIG. 3 shows a block diagram of a system including latch bank 304 and LPDC 102. The latch bank includes a plurality of single phase latches Lo, ... Lk, ... Ln coupled in parallel and operatively connected to node 306 and 308 of LPDC 102. As stated previously the power supply voltage on node 306 and 308 depends on the state of control sig. 114 which is applied directly to LDPC 102 through AND gate 300 to each of the single phase latches. The clock signal is also applied through AND gate 300. The power supply voltages on node 306 and 308, respectively, can either be full voltage swing 600 (FIG. 6) of power supply Vdd/Gd or the reduced voltage swing 602 (FIG. 6) of reduced power supply Vd/Gd. Whichever one is supplied depends on the state of control signal 114.

Still referring to FIG. 3, each of the latch as a clock input generated from And gate 300 and output labeled O0 ... Ok ... On. In the preferred embodiment n=127 which indicates a 128 bit latch bank. In addition, each of the latches has an output labeled as shown in the figure. As shown in the figure LDPC 102 provides variable levels of power supply voltages to the latch bank. In this regard LDPC 102 can be viewed as a dynamic power supply which changes its value depending on the state of control signal 114. Also, the state of the latch bank is reflected in the state of control signal 114. The latch bank has two modes of operation, busy and standby. In busy mode data is written into or read from the latch bank. In this mode supply voltage swings between Vdd and ground. When the latch bank is in a standby mode data is being stored and voltage swing is reduced between Vd and Gd. In this standby mode the reduce power supply voltages are sufficient to prevent a loss of data in the memory. Of course, the reduce voltage result in a reduction of power dissipation within the latch bank. However, reduce voltage is of sufficient magnitude to prevent loss of data in the latch bank. In experimental results obtain from the configuration shown in FIG. 3 the power dissipation is reduced as much as 80% when the latch is in standby mode. It was also determined that even though the voltage was reduced to limit power dissipation no loss of data occurred. It should also be noted that by gating the clock with control signal 100 no clock signal is applied to the latch bank when control signal 114 is in the "0" state further reducing power dissipation within the latch bank.

Figure 4:
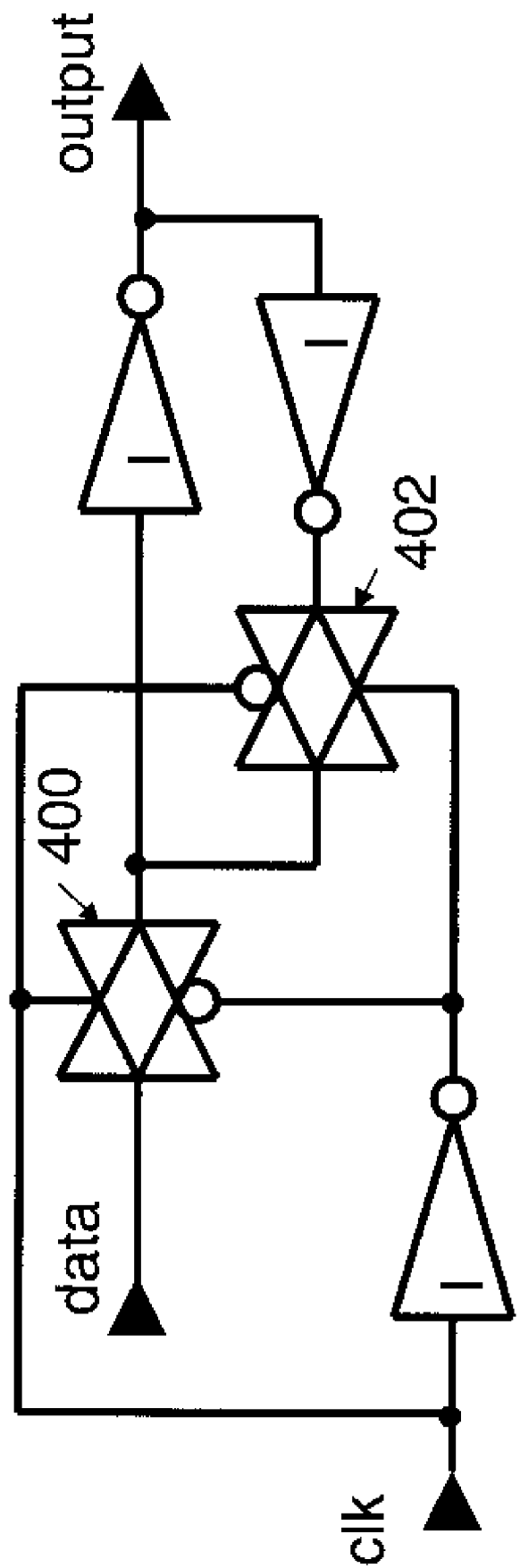
FIG. 4 shows circuit diagram for latch used in FIG. 3.

FIG. 4 shows a circuit diagram for each of the latches use in FIG. 3. The structure includes pass gates 400 and 402 interconnected with inverters I operatively connected as shown in the figure. The direction of signal flow are shown by arrows in the figure. The pass gate structure is well know in the prior art, therefore, showing of detailed structure for the pass gate is not warranted.

Figure 5:
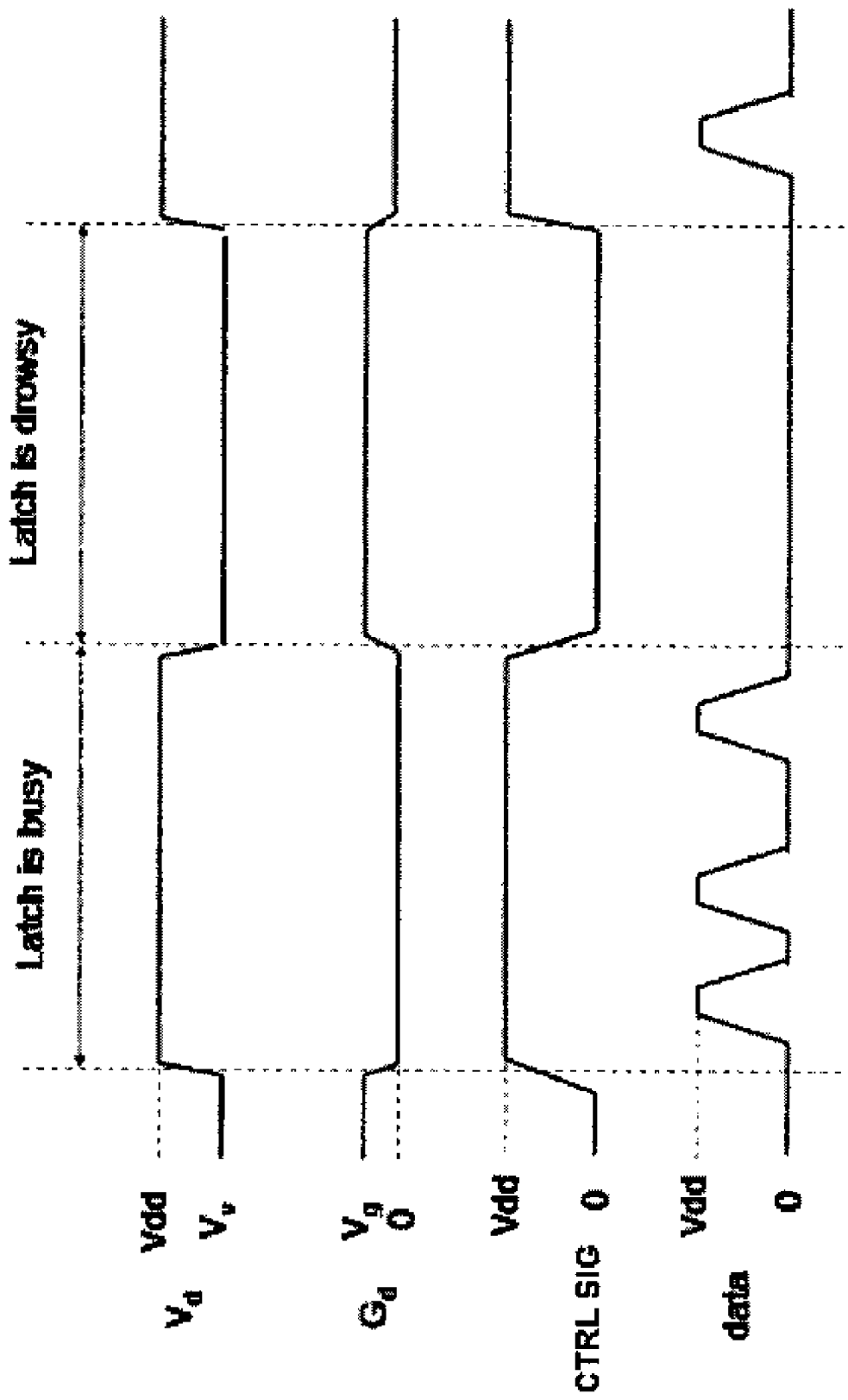
FIG. 5 shows waveform characterizing operation of the latch array/LPDC shown in FIG. 3.

FIG. 5 shows a graphically representation of wave forms that characterize the operation of the LDPC 102 combined with a latch bank such as the combined system shown in FIG. 3. A full cycle of operation is shown partitioned as "latch is busy" and "latch is drowsy". When the latch is busy control signal is positive extending from 0 to Vdd. Simultaneously, the voltage which is applied to the latch is full voltage extending from 0 to Vdd. During this time interval data is written in or read from the latch. In the figure the data is shown as a positive logical "1" signal. In the drowsy phase of operation reduced voltage swing between Vd and Gd is applied to the latches. It should be noted in this mode of operation, Vd, although positive, is less than Vdd whereas Gd is greater than 0. During this time control signal is logical "0" and data stored in memory is "0" (Gnd). When Vd and Gd is applied to the latch bank the current flow between the two virtual rails Vd and Gd is reduced resulting in reduced leakage power being dissipated in the latch bank.

Figure 7:
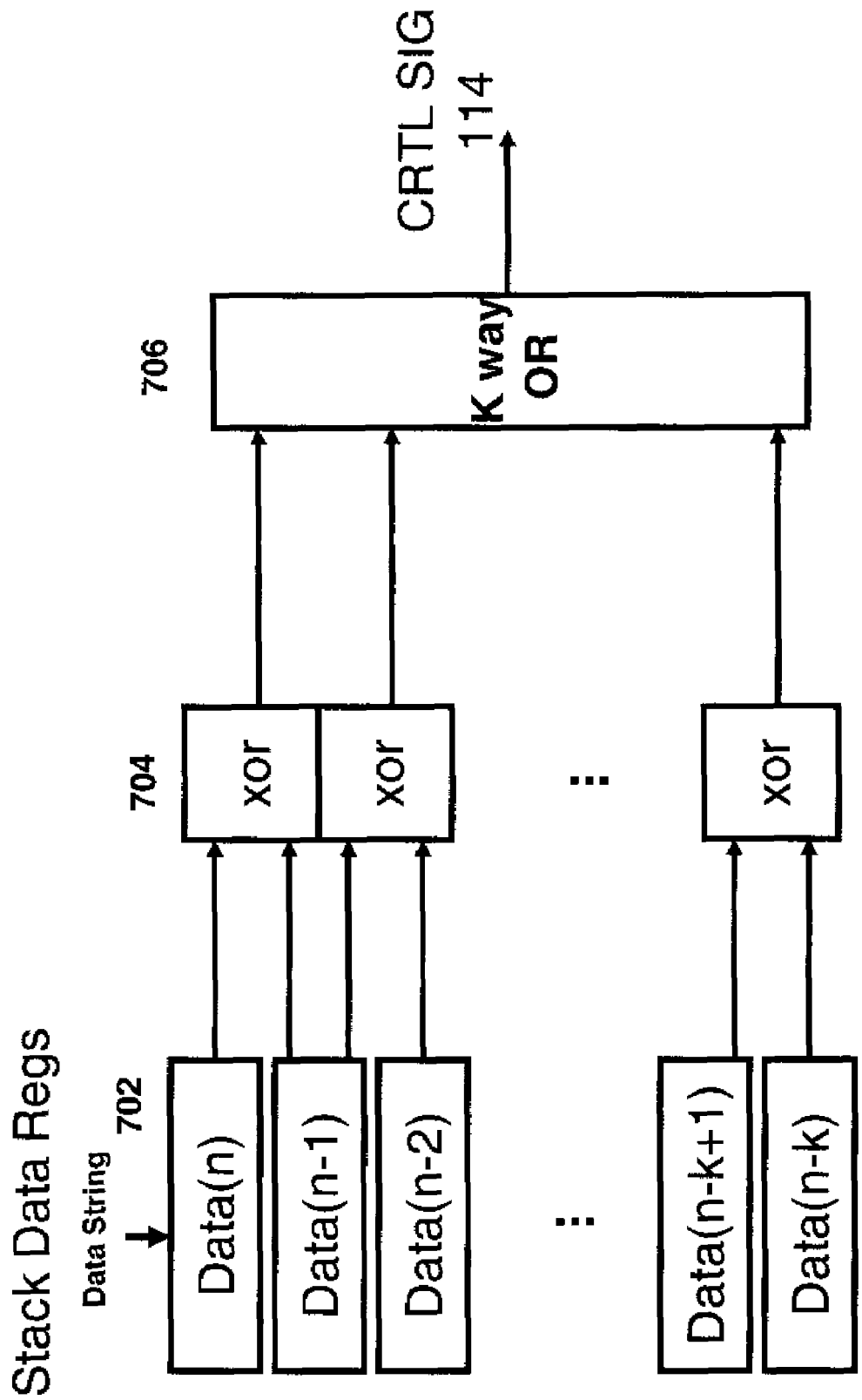
FIG. 7 shows a diagram of a circuit that generates the control signal.

FIG. 7 shows a diagram of a circuit that generates the control signal, CRTL SIG 114 for LDPC 102. The circuit includes a stack of registers 702 coupled via a set of XOR gates 704 to a k-way OR gate 706, with k having a value equivalent to the number of inputs of the OR gate. The circuit generates a pulse signal depending on the change in the input data string. The control signal 114 is required for LDPC 102 to operative for "busy" or "sleep" mode of Semiconductor Module 112 that coupled with the former. This circuit works as follows: on a data line, we store the data on the historical k clock cycles along with the current one in the stacked registers. We refer the data value in the $n^{th}$, $(n-1)^{th}$, $(n-2)^{th}$, and $(n-k)^{th}$ clock cycle as $d_n, d_{n-1}, d_{n-2}, \ldots,$ and $d_{n-k}$. The control signal is generated if at least, in two consecutive cycles, the data is different during the past k continuous cycles, such that $d_n != d_{n-1}$, or $d_{n-1} != d_{n-2}$ or ... or $d_{n+k+1} != d_{n-k}$. Based on this arrangement, the control signal 114 is therefore defined by the logic expression: CRTL SIG=or(xor($d_n$, $d_{n-1}$), xor($d_{n-1}$, $d_{n-2}$), ..., xor ($d_{n+k+1}$, $d_{n-k}$)).

Once the CRTL SIG is generated, it is held high until the data line at least changes its state once again during k successive cycles. This is a designated schedule to avoid the power penalty of switching the control signal 114 in the scenario where the data changes too often. For example, we can use a history of 3 cycles; a suitable scheme can be derived based on the function and activity of the data.

In the foregoing specification, the invention has been described with reference to specific exemplary embodiments thereof. It will, however, be appreciated that various modification and changes maybe made thereto without departing from the broader spirit and the scope of the invention set forth in the depending claims. The specification and drawings are accordingly to be regarded in an illustrative rather than being restrictive.

What is claimed is:

1. A method for operating a controller that includes at least a first circuit arrangement and a second circuit arrangement, the method comprising:
   the controller receiving power from a power supply, via a positive power rail and a ground power rail having a first differential supply voltage there between;
   the controller receiving a control signal;
   in response to the control signal indicating a first state, the first circuit arrangement of the controller providing the first differential supply voltage at a differential output of the controller;
   in response to the control signal indicating a second state, the second circuit arrangement of the controller:
      generating a second differential supply voltage from the first differential supply voltage, wherein the second differential supply voltage is less than the first differential supply voltage; and
      providing the reduced second differential supply voltage at said differential output of the controller
   wherein the first circuit arrangement providing the first differential supply voltage includes:
      a first device in the first circuit arrangement providing charging current to a switching device in the first circuit arrangement;

the switching device, responsive to the control signal indicating the first state, providing a voltage of the ground power rail to a non-inverting buffer; and
a second device, coupled to an output of the non-inverting buffer, providing a voltage of the positive power rail to the differential output of the controller.

2. The method of claim 1, wherein:
the differential output of the controller is coupled to a semiconductor device; and
the first state of the control signal is associated with a normal mode of the semiconductor device; and
providing the first differential supply voltage at the differential output comprises powering the semiconductor device with the first differential supply voltage.

3. The method of claim 1, wherein:
the differential output of the controller is coupled to a semiconductor device; and
the second state of the control signal is associated with a dormant mode of the semiconductor device; and
providing the second differential supply voltage at the differential output comprises powering the semiconductor device with the second differential supply voltage.

4. The method of claim 1, wherein:
the second circuit arrangement includes:
  a switching device;
  first and second devices; and
  a buffer coupled to the first and second devices; and
  providing the reduced second differential supply voltage includes:
    the switching device, responsive to the control signal indicating the second state, activating the first device to provide an input to the buffer;
    the buffer activating the second device; and
    the first and second devices and buffer cooperating to provide a lower rail voltage of the second differential supply voltage to the differential output of the controller.

5. The method of claim 1, wherein providing the reduced second differential supply voltage at the differential output of the controller comprises providing the reduced second differential supply voltage at the differential output of the controller only in response to the control signal indicating the second state.

6. The method of claim 1, wherein:
the second differential power supply voltage has an upper rail voltage and a lower rail voltage; and
the upper rail voltage of the second differential power supply voltage is less than that of the positive power rail and the lower rail voltage of the second differential power supply voltage is greater than that of the ground power rail.

7. The method of claim 1, wherein the first circuit arrangement providing the first differential supply voltage includes:
a first switching device receiving the control signal; and
a non-inverting first buffer operatively coupled to the first switching device receiving a voltage of the positive power rail.

8. A method for operating a controller that includes at least a first circuit arrangement and a second circuit arrangement, the method comprising:
the controller receiving power from a power supply via a positive power rail and a ground power rail having a first differential supply voltage there between;
the controller receiving a control signal;
in response to the control signal indicating a first state, the first circuit arrangement of the controller providing the first differential supply voltage at a differential output of the controller;
in response to the control signal indicating a second state, the second circuit arrangement of the controller:
  generating a second differential supply voltage from the first differential supply voltage, wherein the second differential supply voltage is less than the first differential supply voltage; and
  providing the reduced second differential supply voltage at the differential output of the controller;
wherein the first circuit arrangement includes:
  a first device and a second device;
  a first switching device for receiving the control signal; and
  a non-inverting first buffer operatively coupled to the first switching device; and
wherein the first circuit arrangement providing the first differential supply voltage includes:
  the first device in the first circuit arrangement providing charging current to the first switching device; and
  the second device in the first circuit arrangement providing a voltage of the positive power rail to the non-inverting first buffer.

9. The method of claim 8, wherein:
the differential output of the controller is coupled to a semiconductor device; and
the first state of the control signal is associated with a normal mode of the semiconductor device; and
providing the first differential supply voltage at the differential output comprises powering the semiconductor device with the first differential supply voltage.

10. The method of claim 8, wherein:
the differential output of the controller is coupled to a semiconductor device; and
the second state of the control signal is associated with a dormant mode of the semiconductor device; and
providing the second differential supply voltage at the differential output comprises powering the semiconductor device with the second differential supply voltage.

11. The method of claim 8, wherein:
the second circuit arrangement includes:
  a switching device;
  first and second devices; and
  a buffer coupled to the first and second devices; and
providing the reduced second differential supply voltage includes:
  the switching device, responsive to the control signal indicating the second state, activating the first device to provide an input to the buffer;
  the buffer activating the second device; and
  the first and second devices and buffer cooperating to provide a lower rail voltage of the second differential supply voltage to the differential output of the controller.

12. The method of claim 8, wherein providing the reduced second differential supply voltage at the differential output of the controller comprises providing the reduced second differential supply voltage at the differential output of the controller only in response to the control signal indicating the second state.

13. The method of claim 8, wherein:
the second differential power supply voltage has an upper rail voltage and a lower rail voltage; and
the upper rail voltage of the second differential power supply voltage is less than that of the positive power rail and the lower rail voltage of the second differential power supply voltage is greater than that of the ground power rail.

14. A method for operating a controller that includes at least a first circuit arrangement and a second circuit arrangement, the method comprising:
- the controller receiving power from a power supply via a positive power rail and a ground power rail having a first differential supply voltage there between;
- the controller receiving a control signal;
- in response to the control signal indicating a first state, the first circuit arrangement of the controller providing the first differential supply voltage at a differential output of the controller;
- in response to the control signal indicating a second state, the second circuit arrangement of the controller:
  - generating a second differential supply voltage from the first differential supply voltage, wherein the second differential supply voltage is less than the first differential supply voltage; and
  - providing the reduced second differential supply voltage at the differential output of the controller;

wherein the first circuit arrangement includes:
- a first device and a second device;
- a first switching device for receiving the control signal; and
- a non-inverting first buffer operatively coupled to the first switching device; and wherein the second circuit arrangement includes:
- a second switching device;
- a first device for supplying charging current operatively coupled to the second switching device;
- a second device, different from the first device operatively coupled to the second switching device;
- a non-inverting second buffer coupled to the second device; and
- a third device; and
- providing the reduced second differential supply voltage includes the third device providing an upper rail voltage of the second differential supply voltage to the second buffer.

* * * * *